United States Patent
Bunker (10) Patent No.: US 6,311,299 B1
(45) Date of Patent: Oct. 30, 2001

(54) DATA COMPRESSION CIRCUIT AND METHOD FOR TESTING EMBEDDED MEMORY DEVICES

(75) Inventor: Layne G. Bunker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/260,989

(22) Filed: Mar. 1, 1999

(51) Int. Cl.$^7$ .............................. G11C 29/00; G01R 31/28; G06F 11/00
(52) U.S. Cl. ............................................. 714/719; 714/736
(58) Field of Search ................................... 714/3, 5, 6, 9, 714/718, 719

(56) References Cited

U.S. PATENT DOCUMENTS

| | | | |
|---|---|---|---|
| 4,958,345 | * 9/1990 | Fujisaki ................................. | 714/720 |
| 5,317,573 | * 5/1994 | Bula et al. ............................. | 714/711 |
| 5,644,578 | * 7/1997 | Ohsawa ................................. | 714/719 |
| 5,668,819 | * 9/1997 | Fukushima ........................... | 714/736 |
| 5,875,195 | * 2/1999 | Dixon .................................... | 714/719 |
| 5,995,424 | * 11/1999 | Lawrence et al. .................... | 365/201 |
| 6,154,862 | * 11/2000 | Tabata et al. ......................... | 714/719 |
| 6,163,875 | * 12/2000 | Suzuki .................................... | 716/4 |

\* cited by examiner

*Primary Examiner*—Albert Decady
*Assistant Examiner*—Joseph D. Torres (74) *Attorney, Agent, or Firm*—Dorsey & Whitney LLP (57) ABSTRACT

A test circuit enables a memory tester to test for defective memory cells in a memory portion of an Embedded DRAM or other memory device having a relatively wide internal data path. The Embedded DRAM includes a memory having an array of memory cells, the memory being coupled to a logic circuit. The test circuit includes at least one external terminal and a plurality of data masking circuits. Each data masking circuit is coupled to a respective one of the arrays and transfers data signals to and from addressed memory cells in the array. The data signals are selectively masked responsive to a data masking signal. A plurality of data compression circuits each is coupled to a respective data masking circuit to receive a respective data signal. Each data compression circuit compares each of the data signals applied on its respective inputs to an expected value and generates an active error signal on a respective external terminal responsive to any of the applied data signals not having the expected value. When the test mode signal goes active, a test control circuit applies addressed data to the data masking circuits. The control circuit initially disables the data masking signals so the addressed data is not masked and controls the data compression circuits to generate the respective error signals responsive to the applied data. When at least one the error signals goes active, the test control signal goes active causing the test control circuit to control the data masking signals to sequentially mask each data signal applied to the data masking circuit that generated the active error signal to enable an external tester to detect a defective memory cell from the error signals.

33 Claims, 3 Drawing Sheets

DATA COMPRESSION CIRCUIT AND METHOD FOR TESTING EMBEDDED MEMORY DEVICES

TECHNICAL FIELD

The present invention relates generally to semiconductor memories, and more specifically to a method and circuit for utilizing data compression to test Embedded DRAMs or other memory devices having wide internal data paths.

BACKGROUND OF THE INVENTION

Advances in the design and fabrication of integrated circuits have resulted in significant decreases in the size of transistors and other components forming such integrated circuits. Accordingly, the density of transistors and other components that may be formed in a semiconductor substrate of a given size has increased dramatically. Such dramatic increases in the density of components have enabled manufacturers to fabricate high capacity memory devices in the same size substrate previously required for much lower capacity devices. Similarly, for microprocessors and other logic circuits, such increased component density has enabled manufacturers to increase functionality by including additional circuitry on the substrate.

Figure 1:
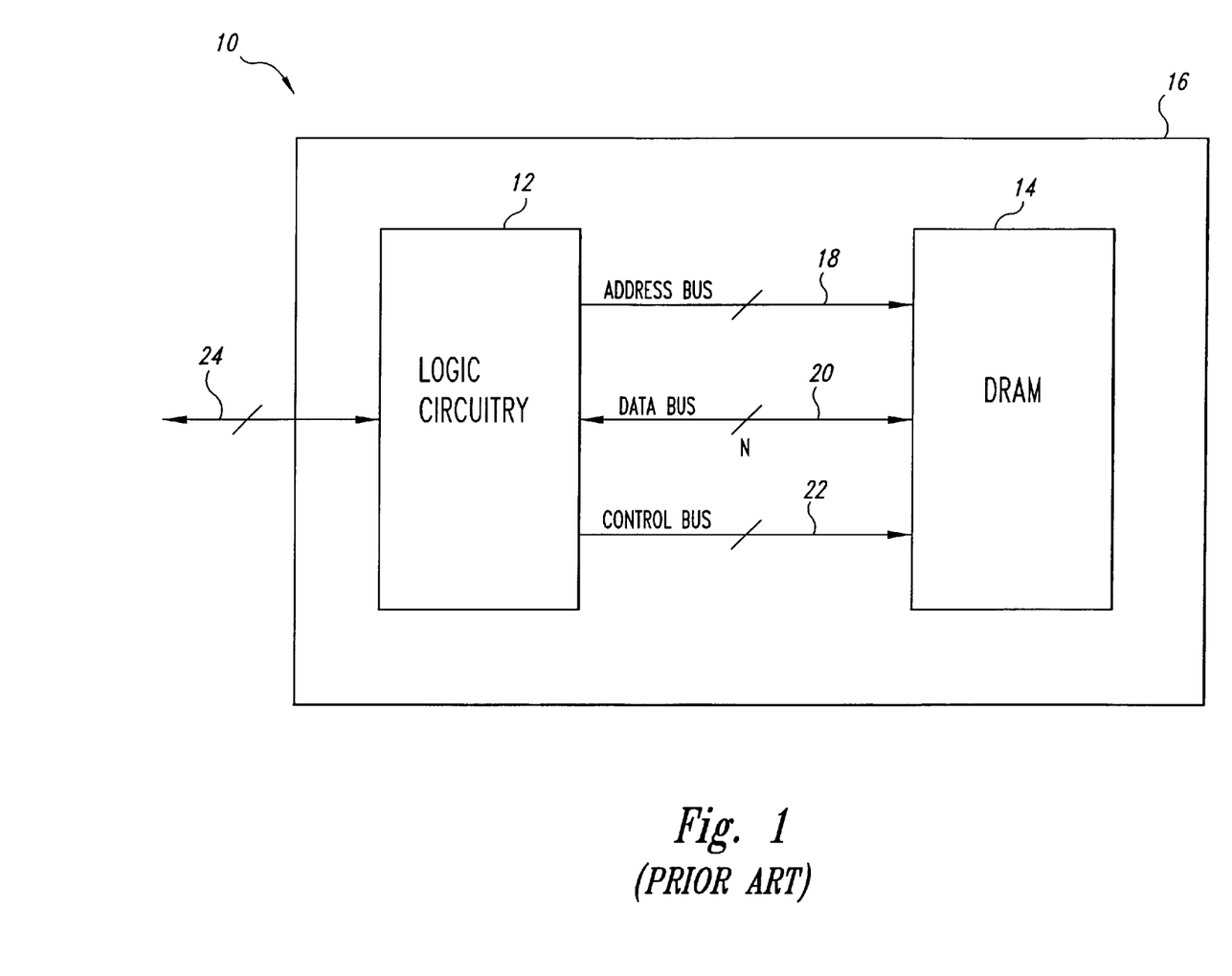
FIG. 1 is a functional block diagram of a conventional Embedded DRAM.

In addition to improving functionality and performance of existing types of integrated circuits, increased component density has enabled manufacturers to develop a new type of integrated circuit called an "Embedded DRAM" in which logic circuitry and dynamic random access memory ("DRAM"), or other types of memory such as static RAMs or packetized memory devices like SLDRAMs, are formed in the same integrated circuit. In other words, the logic circuitry may be "embedded" in the DRAM. FIG. 1 is a block diagram of an Embedded DRAM 10 including logic circuitry 12 and a DRAM 14 formed in a semiconductor substrate 16. The logic circuitry 12 may be designed to perform a specific function, or may be more general purpose circuitry, such as a microprocessor performing a variety of different tasks. The logic circuitry 12 is preferably coupled to the DRAM 14 through an address bus 18, internal data bus 20, and control bus 22, and applies address, data, and control signals on these respective busses to transfer data to and from the DRAM 14. The logic circuitry 12 is further coupled to external terminals 24 on which the logic circuitry transfers information to and from external circuits (not shown in FIG. 1) coupled to the Embedded DRAM 10.

In the Embedded DRAM 10, forming the logic circuitry 12 and the DRAM 14 in the same semiconductor substrate 16 yields numerous performance benefits. First, the bandwidth of the DRAM 14 may be substantially increased by increasing the width N of the internal data bus 20, where N may be 128, 256, or 512 bits, or even wider. As understood by one skilled in the art, increasing the width N of the internal data bus 20 increases the bandwidth of the DRAM 14 by enabling more data to be transferred during each access of the DRAM 14. In a conventional DRAM, an external data bus of the DRAM has a width that is limited by a number of factors, including the number of pins that can physically be formed on a package containing the DRAM and noise generated by switching multiple data lines in parallel, as understood by those skilled in the art. In contrast, the internal data bus 20 of the Embedded DRAM 10 requires no external pins, but is instead directly connected to the logic circuitry 12 through traces formed on the substrate 16. Thus, the width N may be very wide which, in turn, dramatically increases the bandwidth of the DRAM 14.

Additional advantages of the Embedded DRAM 10 over conventional discreet interconnected devices include lower power consumption and lower electromagnetic radiation due to the shorter lengths of conductive traces comprising the internal data bus 20. Furthermore, transmission line effects such as reflections and propagation delays are likewise alleviated due to such reduced lengths of the internal data bus 20. The shorter line lengths and corresponding reduced capacitance of individual lines in the bus 20 also reduce the noise resulting when switching the N lines in parallel.

In one application of the Embedded DRAM 10, the logic circuitry 12 is a microprocessor and the DRAM 14 is directly coupled to the microprocessor via the internal data bus 20. As understood by one skilled in the art, a memory controller is typically required between a conventional DRAM and a microprocessor because the DRAM has a much lower bandwidth than the processors Thus, a conventional DRAM creates a "bandwidth bottleneck" that limits the speed at which a computer system including the DRAM and the processor can execute a program. In contrast, in the Embedded DRAM 10 the internal data bus 20 provides a very high bandwidth between the processor and DRAM 14, making the Embedded DRAM 10 well suited to applications requiring very high bandwidths, such as networking, multimedia, and high-resolution graphics systems.

During the manufacture of the Embedded DRAM 10, the DRAM 14 needs to be tested just as with conventional DRAMs. Testing the DRAM 14, however, resents new problems not encountered when testing conventional DRAMs. More specifically, an external memory tester (not shown in FIG. 1) must transfer test data to and from the memory cells in the DRAM 14. The memory tester must be coupled to the DRAM 14 through the external terminals 24 on the Embedded DRAM 10, and must apply address, control, and data signals on such external terminals to transfer data to and from the memory cells in the DRAM 14. Due to the wide internal data bus 20 of the DRAM 14, however, there are many fewer external terminals 24 available on the Embedded DRAM 10 than there are data lines in the internal data bus 20. For example, if the internal data bus 20 is 512 bits wide, the Embedded DRAM 10 cannot include 512 external data terminals plus address and control terminals due to the physical limitations of forming such external terminals 24. Thus, in an Embedded DRAM there is a problem in transferring data between the DRAM and the memory tester when testing the DRAM.

There is a need for a test circuit in an Embedded DRAM that enables a memory tester to test the DRAM portion of the Embedded DRAM.

SUMMARY OF THE INVENTION

The present invention relates to a method and apparatus for testing a memory portion of an embedded memory, such as an Embedded DRAM, or any other integrated circuit having a relatively wide data path. The embedded memory includes a memory having plurality of arrays, the memory being coupled to a logic circuit. According to one inventive aspect of the present invention, a test circuit includes at least one external terminal and a plurality of data masking circuits. Each data masking circuit is coupled to a respective one of the arrays and transfers data signals to and from addressed memory cells in the array. The data signals are selectively masked responsive to a data masking signal. A plurality of data compression circuits each is coupled to a respective data masking circuit to receive a respective data signal. Each data compression circuit compares each of the data signals applied on its respective inputs to an expected value and generates an active error signal on a respective external terminal responsive to any of the applied data signals not having the expected value. A test control circuit is coupled to the data masking circuits and the read data compression circuits, and receives a test signal on an external terminal. The test control circuit operates during a first test mode of operation to apply test data stored in addressed memory cells in the arrays to the read data masking circuits. The control circuit disables the data masking signals during the first test mode so the addressed data is not masked, and controls the data compression circuits to generate the respective error signals responsive to the applied test data. The test control circuit operates during a second test mode when the test signal goes active responsive to at least one of the generated error signals going active to control the data masking signals to sequentially mask respective data signals applied to the data masking circuits to enable an external tester to detect a defective memory cell from the generated error signals.

DETAILED DESCRIPTION OF THE INVENTION

Figure 2:
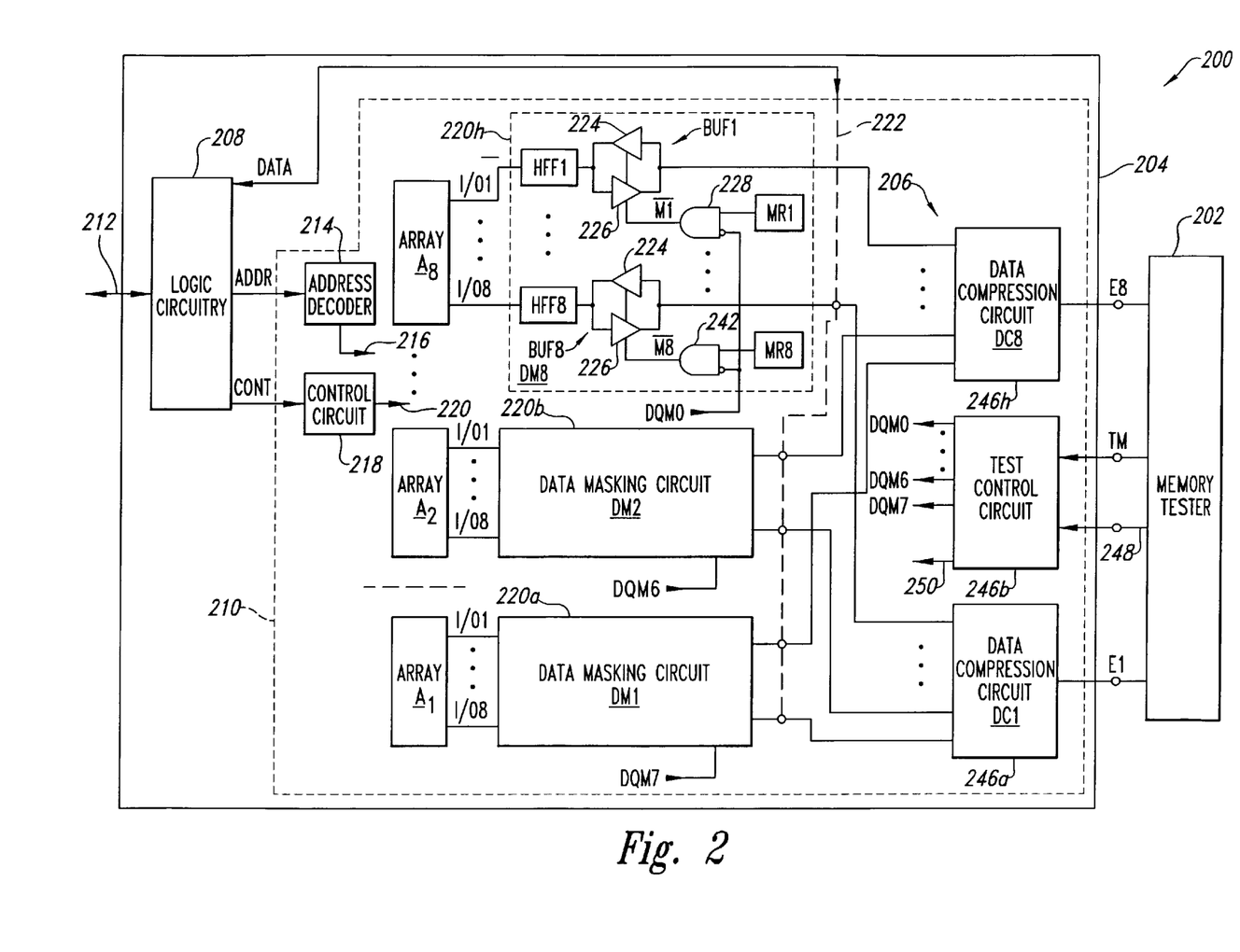
FIG. 2 is a functional block diagram of a test system including an Embedded DRAM having a data compression test circuit according to one embodiment of the present invention.

FIG. 2 is a functional block diagram of a test system 200 including a memory tester 202 coupled to an embedded memory device 204 that includes test circuitry 206 according to one embodiment of the present invention. The embedded memory device 204 includes logic circuitry 208 coupled to a memory 210 through an address bus ADDR, an internal data bus DATA, and a control bus CONT. The memory 210 may be a DRAM, SRAM, FLASH memory, Or packetized memory device such as an SLDRAM, as will be understood by those skilled in the art. The test circuitry 206 is contained in the memory 210, and operates during a first test mode to compress test data read from a plurality of memory-cell arrays $A_1$–$A_8$ and generate a plurality of error signals E1–E8 that are output to the memory tester 202. In response to one of the error signals E1–E8 going active, the test circuitry 206 thereafter operates in a second test mode during which it enables the memory tester 202 to determine the specific address of a defective memory-cell in one of the arrays $A_1$–$A_8$, as will now be explained in more detail below.

The logic circuitry 208 communicates with circuits external to the embedded memory device 204 through external terminals 212, and transfers data to and from the memory 210 over the DATA bus. To access data stored in the memory 210, the logic circuitry 208 applies address signals on the ADDR bus. An address decoder 214 in the memory 210 latches the applied address signals on the APDR bus, and applies decoded address signals 216 to access addressed memory cells in the arrays $A_1$–$A_8$. A control circuit 218 receives control signals from the logic circuitry 208 over the CONT bus, and generates a plurality of control signals 220 that are applied to numerous components within the memory 210 to control the transfer of data between the memory 210 and the logic circuitry 208 during normal operation of the embedded memory device 204. The address decoder 214 and control circuit 218 may be formed from conventional circuitry that is understood by those skilled in the art.

Each of the arrays $A_1$–$A_8$ includes a plurality of memory cells (not shown) arranged in rows and columns, the memory cells in each column being coupled to one of a pair of complementary digit lines, as understood by those skilled in the art. The data stored in addressed memory cells in each array $A_1$–$A_8$ is transferred from the corresponding digit lines onto respective pairs of complementary input/output lines I/O1–I/O8. The input/output lines I/O1–I/O8 are each shown as including only a single line, but one skilled in the art will realize that each typically includes complementary signal lines. A plurality of data masking circuits DM1–DM8 220a–220h are coupled to the arrays $A_1$–$A_8$, respectively, each of the data masking circuits 220 transferring data from the internal data bus DATA over the input/output lines I/O1–I/O8 to addressed memory cells in the corresponding array $A_1$–$A_8$ during write data transfer operations. During read data transfer operations, the data masking circuits DM1–DM8 220 transfer read data placed on the input/output lines I/O–1/O8 of each of the arrays $A_1$–$A_8$ to the data bus DATA. In FIG. 2, a dashed line 222 is shown going through the outputs from each of the data masking circuits DM1–DM8 merely to represent that the outputs from the data masking circuits correspond to the internal data bus DATA of the embedded memory device 204.

Each of the data masking circuits DM1–DM8 220 is identical, and thus for the sake of brevity only the data masking circuit DM8 220h is shown and will be described in more detail. The data masking circuit DM8 includes a plurality of helper flip-flops HFF1–HFF8 that sense and store read data placed on the input/output lines I/O1–I/O8, respectively, from the array $A_1$–$A_8$ during read operations and apply write data on the I/O1–I/O8 lines during write operations. The helper flip-flops HFF1–HFF8 are coupled to bi-directional buffer circuits BUF1–BUF8, respectively, each of which transfers data between the flip-flop and a corresponding line of the DATA bus when activated. Each of the buffer circuits BUF1–BUF8 includes a cross-coupled data write buffer 224 and data read buffer 226 that receive a corresponding masking signal $\overline{M1}$–$\overline{M8}$ from a plurality Of NAND gates 228–242 respectively. Each of the buffers 224 and 226 transfers the data placed on its input to its output when the corresponding $\overline{M1}$–$\overline{M8}$ signal is inactive high, and places its output in a high impedance state when the corresponding $\overline{M1}$–$\overline{M8}$ signal is active low. For example, when the $\overline{M1}$ signal from the NAND gate 228 is inactive high, the write buffer 224 and read buffer 226 in the buffer circuit BUF1 are both enabled, and when the $\overline{M1}$ signal is active low both buffers 224, 226 are disabled.

The NAND gates 228–242 receive a byte mask signal DQM0 on respective low true first inputs, and each of the NAND gates also receives a respective write-per-bit MR1–MR8 mask bit stored in a corresponding bit-mask location of a write mask register MR. When the DQM0 signal is active high, the NAND gates 228–242 drive the $\overline{M1}$–$\overline{M8}$ signals active low masking eight bits or a "byte" of write data from the array $A_1$. The bits MR1–MR8 allow individual bits in the byte to be masked when the DQM0 signal is inactive low. The data write buffers 224, NAND gates 228–242, mask bits MR1–MR8, and byte-mask signal DQM0 thus operate in a conventional manner to provide write-per-bit and byte-write masking, as understood by those skilled in the art. The data read buffers 226 NAND gates 228–242, and byte-mask signal DQM0 operate to provide a byte-read mask that masks bytes of read data from the array $A_1$, as will be described in more detail below. The data masking circuits DM1–DM7 receive byte-mask signals DQM1–DQM7 and operate in the same manner as described for the circuit DM0 responsive to these signals.

During normal read operations of the Embedded memory device 204, the addressed memory cells in the arrays $A_1$–$A_8$ place their data on the I/O1/–I/O8 lines where the helper flip-flops HFF1–HFF8 sense and output the data to the buffer circuits BUF1–BUF8 which, in turn, transfer this read data through the corresponding read buffers 226 to the DATA bus. The DQM0–DQM7 signals are inactive low and the mask bits MR1–MR8 are set during normal read operations, causing the NAND gates 228–242 to drive the masking signals $\overline{M1}$–$\overline{M8}$ inactive high so no data is masked. During normal write operations, the logic circuitry 208 places write data on the DATA bus, and this data is transferred through the write buffers 224 subject to the mask signals $\overline{M1}$–$\overline{M8}$ and the mask bits MR1–MR8. The write data from each of the buffers 224 is applied to the corresponding helper flip-flop HFF1–HFF8 which, in turn, outputs the write data to the I/O1–I/O8 lines where it is transferred to the addressed memory cells in the array $A_1$–$A_8$.

The test circuitry 206 includes a plurality of data compression circuits DC1–DC8 246a–246h, each of the data compression circuits receiving the same bit from each of the data masking circuits DM1–DM8, as shown. For example, the DC8 data compression circuit 246h receives the read data bit placed on the input/output line I/O1 from each of the arrays $A_1$–$A_8$. In this way, each of the data compression circuits DC1–DC8 receives a respective bit of read data applied on the DATA bus from each of the arrays $A_1$–$A_8$. Each of the data compression circuits DC1–DC8 determines whether each of the bits applied on its inputs has the same binary value, and generates a corresponding error signal E1–E8 in response to this determination. Each of these error signals E1–E8 is applied on a respective external terminal of the embedded memory device 204 where it may be monitored by the memory tester 202. When each of the applied read data bits has the same binary value, each of the data compression circuits DC1–DC8 drives its corresponding error signal E1–E8 inactive, and when any of the applied read data bits applied to a given data compensation circuit DC1–DC8 has a binary value different from that of the other applied read data bits, the data compression circuit DC1–DC8 drives the corresponding error signal E1–E8 active. One skilled in the art will understand that circuitry capable of performing the required function of the data compression circuits DC1–DC8 is conventional. For example, each data compression circuit DC1–DC8 could include a NAND gate and a NOR gate receiving the corresponding read data bits on their respective inputs, each of the NAND gate and NOR gate applying their respective output to an XOR gate which, in turn, generates the corresponding error signal E1–E8. Furthermore, the data compression circuits DC1–DC8 may include circuitry to compare each of the applied read data bits to a corresponding predetermined value.

The test circuitry 206 further includes a test control circuit 246 receiving a test mode signal TM and a plurality of control signals 248 from the memory tester 202. In response to these signals, the test control signal 246 generates a plurality of control signals 250 along with the byte-mask signals DQM0–DQM7 to control operation of the data masking circuits DM1–DM8, data compression circuits DC1–DC8, and other components within the memory 210 during the test mode of operation, as will be described in more detail below.

The overall operation of the test system 200 will now be described in more detail. In operation, the memory tester 202 drives the TM signal active causing the test control circuit 246 to place the embedded memory device 204 in the write test mode of operation. The memory tester 202 thereafter generates the signals 248, causing the test control circuit 246 to transfer write data into each of the memory cells in the arrays $A_1$–$A_8$. In writing test data to each of the memory cells in the arrays $A_1$–$A_8$, the test control circuit 246 may generate the write test data or this write test data may be supplied by the memory tester 202. In the embodiment of FIG. 2, write test data having the same binary value, either a binary 0 or binary 1, is written to each of the memory cells in the arrays $A_1$–$A_8$. This is true because the data compression circuits DC1–DC8 determine whether read data from a plurality of memory cells in the arrays $A_1$–$A_8$ has the same binary value, as previously described. During the write test mode, the circuit 246 also drives the DQM0–DQM7 signals inactive low so the write buffers 224 do not mask any of the test data being written to the arrays $A_1$–$A_8$.

Once test data has been written to all memory cells in the arrays $A_1$–$A_8$, the memory tester 202 generates the control signals 248 to place the test control circuit 246 in a read test data mode of operation. During the read test data mode, the test control circuit 246 operates in two modes, a non-masked mode and a masked mode. In the non-masked mode, the test control circuit 246 drives each of the byte mask signals DQM0–DQM7 inactive low and stores binary 1's in each of the locations MR1–MR8. As a result, each of the NAND gates 228–242 in the data masking circuits DM1–DM8 drives the corresponding masking signals M1–M8 inactive high thereby enabling the corresponding read buffers 226 so that the read test data is not masked. The test control circuit 246 thereafter generates the control signals 250 to access memory cells in the arrays $A_1$–$A_8$ and apply the read test data stored in each of these addressed memory cells through the circuits DM1–DM8 to the data compression circuits DC1–DC8. In response to the applied read test data, the data compression circuits DC1–DC8 determine whether the applied read test data bits have the same binary values, and generate the error signals E1–E8 in response to these determinations. The test system 200 continues operating in this mode until one of the data compression circuits DC1–DC8 drives its corresponding error signal E1–E8 active, indicating that one of the bits in the applied read data has a different binary value than the other bits and thereby indicating a defective memory cell in one of the arrays $A_1$–$A_8$.

At this point, the specific memory cell that is defective is not known and can be located in any of the arrays $A_1$–$A_8$. For example, assume the data compression circuit DC8 drives the error signal E8 active. At this point, the memory tester 202 determines a defective memory cell in one of the arrays $A_1$–$A_8$ has been detected, but the defective memory cell could be in any one of the arrays $A_1$–$A_8$ since the data compression circuit DC8 compresses a single data bit from each of the arrays. The memory tester 202 then generates the control signals 248 to place the test control circuit 246 in the mask mode of operation. During the mask mode of operation, the test control circuit 246 sequentially activates the byte mask signals DQM0–DQM7 in order to enable the memory tester 202 to determine the specific memory cell that is defective, as will now be explained in more detail. For example, assume the data compression circuit DC8 drives the E8 signal active. The test control circuit 246 then initially drives the DQM0 signal active high and maintains the DQM1–DQM7 signals inactive low. In this situation, the data bit from the data masking circuit DM8 that is applied to the compression circuit DC8 is masked. When the data bit from the masking circuit DM8 is masked, the compression circuit DC8 compares the binary values of the bits from all other masking circuits DC1–DC7 and generates the error signal E8 in response to this comparison. If the defective memory cell is in the array $A_1$, then the error signal E8 goes inactive and the memory tester 202 determines the array $A_1$ contains the defective memory cell. The memory tester 202 may then apply the control signals 248 to cause the test control circuit 246 to repair the defective memory cell in the array $A_1$.

If the defective memory cell is in not in the array $A_1$, but is instead in one of the arrays $A_1$–$A_8$, then the error signal E8 remains active since the defective cell continues applying data to the compression circuit DC8. As a result, the memory tester 202 determines the array $A_1$ does not contain the defective memory cell, and thereafter drives the DQM0 signal inactive low and drives the DQM1 signals active high. At this point, the memory tester 202 operates in the same manner, once again monitoring the error signal E8 to determine whether the array $A_2$ contains the defective memory cell. The memory tester 202 continues operating in this manner to detect and repair all defective memory cells in the arrays $A_1$–$A_8$.

In this way, the test circuit 206 enables the memory tester 202 to detect defective memory cells in the arrays $A_1$–$A_8$ in the Embedded memory device 204. Moreover, since many conventional Embedded memory devices include write-per-bit and write-byte masking features, the test circuit 206 enables the use of existing circuitry in the Embedded memory device to be slightly modified in order to allow an external memory tester to detect the precise location of defective memory cells in arrays of the Embedded memory device. It should noted that although the test circuit 206 is described as contained in the Embedded memory device 204, the test circuit may be utilized in Embedded memory devices having different architectures or in other integrated circuits having wide internal data paths. For example, the Embedded memory device 204 is described as including eight arrays $A_1$–$A_8$, eight masking circuits DM1–DM8, and eight data compression circuits DC1–DC8, but the exact numbers of each of these components may, of course, be varied, as may the number of data bits compressed by each read data compression circuit.

Figure 3:
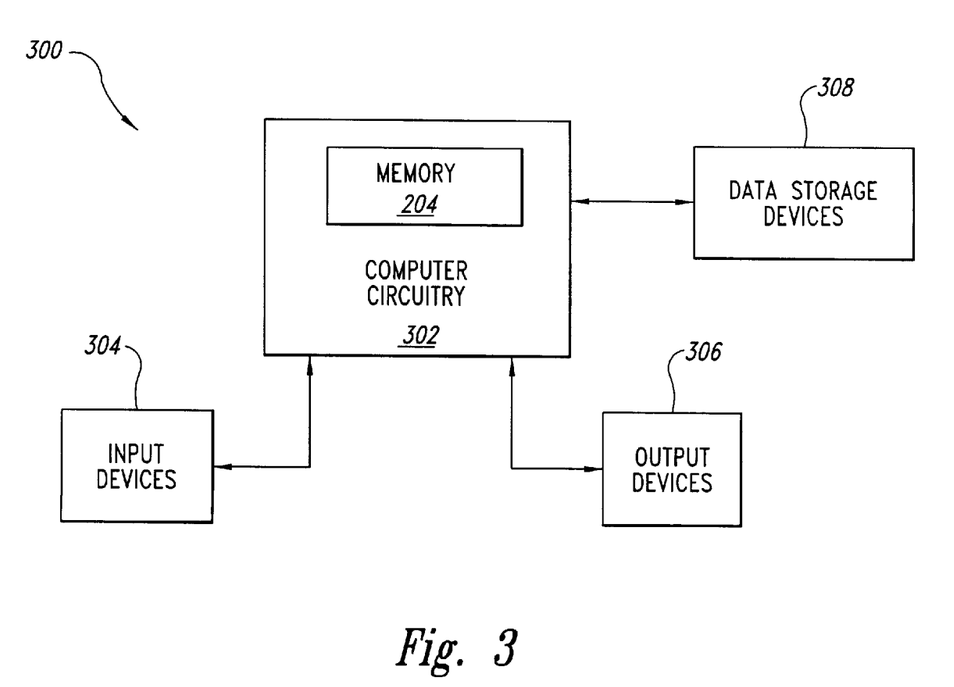
FIG. 3 is functional block diagram of a computer system including the Embedded DRAM of FIG. 2.

FIG. 3 is a block diagram of a computer system 300 including the Embedded memory device 204 of FIG. 2. The computer system 300 includes computer circuitry 302 for performing various computing functions, such as executing specific software to perform specific calculations or tasks. In the computer system 300, the Embedded memory device 204 typically has its logic circuitry 210 designed to perform a specific function, such as high-resolution graphics generation or high-speed communications. In addition, the computer system 300 includes one or more input devices 304, such as a keyboard or a mouse, coupled to the computer circuitry 302 to allow an operator to interface with the computer system 300. Typically, the computer system 300 includes one or more output devices 306 coupled to the computer circuitry 302, such output devices typically being a printer or a video terminal. One or more data storage devices 308 are also typically coupled to the computer circuitry 302 to store data or retrieve data from the external storage media (not shown in FIG. 3). Examples of typical data storage devices 308 include hard and floppy disks, tape cassettes, and compact disk read-only memories ("CD-ROMs").

It is to be understood that although various embodiments of the present invention have been set forth in the foregoing description, the above disclosure is illustrative only, and changes may be made in detail while remaining within the broad principles of the invention. For example, some of the components described above may be implemented using either digital or analog circuitry, or a combination of both, and also, where appropriate, may be realized through software executing on suitable processing circuitry. Accordingly, the present invention is to be limited only by the appended claims.

What is claimed is:

1. A test circuit in an embedded memory device including a plurality of arrays of memory cells and a logic circuit, the test circuit comprising:
   at least one external terminal;
   a plurality of data masking circuits, each data masking circuit being coupled to a respective one of the arrays and operable to transfer data signals to and from addressed memory cells in the array, the data masking circuit masking each data signal responsive to a data masking signal;
   a plurality of read data compression circuits, each read data compression circuit having a plurality of inputs, each input being coupled to a respective data masking circuit to receive a respective data signal from the data masking circuit, and each data compression circuit operable to compare each of the data signals applied on its respective inputs to an expected value and generate an active error signal on a respective external terminal responsive to any of the applied data signals not having the corresponding expected value; and
   a test control circuit coupled to the data masking circuits and the read data compression circuits, and coupled to receive a test signal on an external terminal, the test control circuit operable during a first test mode of operation to apply test data stored in addressed memory cells in the arrays to the read data masking circuits, the control circuit disabling the data masking signals during the first test mode so the addressed data is not masked and controlling the data compression circuits to generate the respective error signals responsive to the applied test data, the control circuit operable during a second test mode when the test signal goes active responsive to at least one of the generated error signals going active to control the data masking signals to sequentially mask respective data signals applied to the data compression circuits to enable an external tester to detect a defective memory cell from the generated error signals.

2. The test circuit of claim 1 wherein each data compression circuit comprises and NAND gate and NOR gate each receiving each of the applied data signals on a respective input, the NAND and NOR gates applying respective outputs to an XOR gate the generates the error signals on its output responsive to any of the applied data signals having a different binary value than all the other applied data signals.

3. The test circuit of claim 1 wherein the test control circuit detects a defective memory cell storing an erroneous data signal by sequentially activating each of the masking signals and causing the data masking circuit to drive the error signal inactive when the erroneous data signal is masked, the test control signal being applied to the control circuit responsive to the error control signal going inactive to indicate the present memory cell being masked is the defective cell.

4. The test circuit of claim 1 further wherein the test control circuit further operates to generate control signals to replace the row of memory cells containing the defective memory cell with a redundant row of memory cells.

5. A test circuit in an embedded memory device including a plurality of arrays of memory cells and a logic circuit, the test circuit comprising:

at least one external terminal;

a plurality of data masking circuits, each data masking circuit being coupled to a respective one of the arrays and operable to transfer data signals to and from addressed memory cells in the array, the data masking circuit masking each data signal responsive to a data masking signal, each data masking circuit comprising, a plurality of helper flip-flop circuits, each helper flip-flop circuit coupled to a respective pair of digit lines in the corresponding array;

a plurality of bidirectional data buffer circuits, each data buffer circuit having a first signal terminal coupled to a respective helper flip-flop and a second signal terminal, and a masking terminal coupled to receive a respective data mask signal, the buffer circuit operable to transfer data between its first and second terminals when the data mask signal is inactive and presenting a high impedance between signal terminals when the data mask signal is active; and a plurality of NAND gates, each NAND gate applying the data mask signal to a respective data buffer circuit, and each NAND gate generating the data mask signal to mask data transferred by the data buffer circuit responsive to a bit mask signal and a respective one of the masking signals;

a plurality of read data compression circuits, each read data compression circuit having plurality of inputs, each input being coupled to a respective data masking circuit to receive a respective data signal from the data masking circuit, and each data compression circuit operable to compare each of the data signals applied on its respective inputs to an expected value and generate an active error signal on a respective external terminal responsive to any of the applied data signals not having the corresponding expected value; and a test control circuit coupled to the data masking circuits and the read data compression circuits, and coupled to receive a test signal on an external terminal, the test control circuit operable during a first test mode of operation to apply test data stored in addressed memory cells in the arrays to the read data masking circuits, the control circuit disabling the data masking signals during the first test mode so the addressed data is not masked and controlling the data compression circuits to generate the respective error signals responsive to the applied test data, the control circuit operable during a second test mode when the test signal goes active responsive to at least one of the generated error signals going active to control the data masking signals to sequentially mask respective data signals applied to the data masking circuits to enable an external tester to detect a defective memory cell from the generated error signals.

6. The test circuit of claim 5 wherein each data buffer circuit comprises a pair of cross-coupled buffers, each buffer having an enable terminal coupled to receive the data mask signal.

7. A test circuit in an embedded memory device, the embedded memory device including a memory having a plurality of arrays of memory cells and a control circuit that generates a plurality of control signals and byte-write masking signals, and the embedded memory device further including a logic circuit coupled to the arrays through internal address, data, and control busses, the test circuit being coupled between the arrays and at least one external terminal and being coupled to the control circuit, the test circuit operable in a normal mode to transfer data between the data bus and the arrays responsive to the control signals and to mask write data responsive to the byte-write mask signals and a plurality of write-per-bit mask bits stored in the memory, the test circuit operable in a first test mode when the byte-write mask signals are inactive and the write-per-bit mask bits are set to first predetermined values to compress read test data from the arrays and generate at least one error signal on a respective external terminal responsive to the compressed read data, and operable in a second test mode when any of the error signals indicates a defective memory cell in one of the arrays to sequentially mask bits of read test data responsive to the byte-write mask signals and compress the unmasked bits to sequentially generate each error signal to enable an external circuit to determine the location of the defective memory cell from each sequentially generated error signal.

8. The test circuit of claim 7 wherein the test circuit comprises a plurality of data compression circuits, each data compression circuit operable to compress the data from a group of memory cells that includes data from one memory cell in each array and generate the corresponding error signal.

9. A test circuit in an embedded memory device, the embedded memory device including a memory having a plurality of arrays of memory cells and a control circuit that generates a plurality of control signals and byte-write masking signals, and the embedded memory device further including a logic circuit coupled to the arrays through internal address, data, and control busses;

the test circuit being coupled between the arrays and at least one external terminal and being coupled to the control circuit, the test circuit comprising, a plurality of read buffers, each read buffer coupled between a line of the internal data bus and an input/output line associated with one of the arrays and coupled to receive a masking signal, the read buffer operable to transfer read data from the input/output line to the corresponding line of the internal data bus when the masking signal is inactive and operable to present a high impedance to the corresponding line of the data bus and thereby mask data on the input/output line from the line of the data bus when the masking signal is active;

the test circuit operable in a normal mode to transfer data between the data bus and the arrays responsive to the control signals and to mask write data responsive to the byte-write mask signals and a plurality of write-per-bit mask bits stored in the memory;

the test circuit operable in a first test mode when the byte-write mask signals are inactive and the write-per-bit mask bits are set to first predetermined values to compress read test data from the arrays and generate at least one error signal on a respective external terminal responsive to the compressed read data; and the test circuit operable in a second test mode when any of the error signals indicates a defective memory cell in one of the arrays to sequentially mask bits of read test data responsive to the byte-write mask signals and compress the unmasked bits to sequentially generate each error signal to enable an external circuit to determine the location of the defective memory cell from each sequentially generated error signal.

10. The test circuit of claim 9 wherein the test circuit comprises a plurality of data compression circuits, each data compression circuit operable to compress the data from a group of memory cells that includes data from one memory cell in each array and generate the corresponding error signal.

11. A test circuit in an embedded memory device including a plurality of arrays of memory cells and a logic circuit, the test circuit comprising:
   at least one external terminal;
   a plurality of data masking circuits, each data masking circuit being coupled to a respective one of the arrays;
   a plurality of data compression circuits, each data compression circuit coupled to a respective data masking circuit and a respective external terminal;
   a test control circuit coupled to the data masking circuits and the data compression circuits, and coupled to an external test control terminal; and
   the control circuit disabling the mask in a first test mode and controlling the data compression circuit to generate the appropriate error signal responsive to applied test data, the test control circuit operable in a second test mode to control the data masking circuits to sequentially mask respective data signals applied to the data compression circuits to allow the detection of the location of a defective memory cell.

12. The test circuit of claim 11 wherein the embedded memory device comprises and Embedded DRAM.

13. A test circuit in an embedded memory device including a plurality of arrays of memory cells and a logic circuit, the test circuit comprising:
   at least one external terminal;
   a plurality of data masking circuits, each data masking circuit being coupled to a respective one of the arrays, each data masking circuit comprising,
      a plurality of helper flip-flop circuits, each helper flip-flop circuit coupled to a respective pair of digit lines in the corresponding array;
      a plurality of bi-directional data buffer circuits, each data buffer circuit having a first signal terminal coupled to a respective helper flip-flop and a second signal terminal; and
      a plurality of NAND gates, each NAND gate coupled to a respective data buffer circuit, and each NAND gate having a data-byte mask input and a write-per-bit terminal;
   a plurality of data compression circuits, each data compression circuit coupled to a respective data masking circuit and a respective external terminal;
   a test control circuit coupled to the data masking circuits and the data compression circuits, and coupled to an external test control terminal; and
   the control circuit disabling the mask in a first test mode and controlling the data compression circuit to generate the appropriate error signal responsive to applied test data, the test control circuit operable in a second test mode to control the data masking circuits to sequentially mask respective data signals applied to the data compression circuits to allow the detection of the location of a defective memory cell.

14. The test circuit of claim 13 wherein each data buffer circuit comprises a write buffer having input, output, and enable terminals, a read buffer having an input and output coupled to the output and input, respectively, of the write buffer pair, the read buffer having an enable terminal coupled to the enable terminal of the write buffer.

15. An embedded memory device formed in a semiconductor substrate, comprising:
   a plurality of external terminals including at least one terminal adapted to receive a test signal;
   a logic circuit coupled to some of the external terminals and operable to perform a desired function; and
   a memory device coupled to the logic circuit through internal address, data, and control, the memory device comprising,
      an address decoder coupled to the address bus,
      a control circuit coupled to the control bus,
      a plurality of arrays coupled to the address decoder and read/write circuit, each array including a plurality of memory cells, and
      a test circuit coupled to the at least one external terminal adapted to receive the test signal, the test circuit comprising:
         a plurality of data masking circuits, each data masking circuit being coupled to a respective one of the arrays and operable to transfer data signals between addressed memory cells in the array and the data bus, the data masking circuit masking each data signal responsive to a data masking signal;
         a plurality of read data compression circuits, each read data compression circuit having a plurality of inputs, each input being coupled to a respective data masking circuit to receive a respective data signal from the data masking circuit, and each data compression circuit operable to compare each of the data signals applied on its respective inputs to an expected value and generate an active error signal on a respective external terminal responsive to any of the applied data signals not having the corresponding expected value; and
         a test control circuit coupled to the data masking circuits and the read data compression circuits, and coupled to receive a test signal on an external terminal, the test control circuit operable during a first test mode of operation to apply test data stored in addressed memory cells in the arrays to the read data masking circuits, the control circuit disabling the data masking signals during the first test mode so the addressed data is not masked and controlling the data compression circuits to generate the respective error signals responsive to the applied data, the control circuit operable during a second test mode when the test signal goes active responsive to at least one of the generated error signals going active to control the data masking signals to sequentially mask respective data signals applied to the data compression circuits to enable an external tester to detect a defective memory cell from the generated error signals.

16. The embedded memory device of claim 15 wherein the memory device comprises a DRAM.

17. A test system for detecting defective memory cells in an embedded memory device, comprising:
   an embedded memory device, comprising:
      a plurality of external terminals including at least one terminal adapted to receive a test signal;
      a logic circuit coupled to some of the external terminals and operable to perform a desired function; and
      a memory device coupled to the logic circuit through internal address, control, and data busses, the memory device comprising, an address decoder adapted to receive address signals applied on the internal address bus;

a control circuit coupled to the control bus;

an array coupled to the address decoder and read/write circuit, the array including a plurality of memory cells; and a test circuit coupled to the at least one external terminal adapted to receive the test signal, the test circuit comprising:

a plurality of data masking circuits, each data masking circuit being coupled to a respective one of the arrays and operable to transfer data signals between addressed memory cells in the array and the data bus, the data masking circuit masking each data signal responsive to a data masking signal;

a plurality of read data compression circuits, each read data compression circuit having a plurality of inputs, each input being coupled to a respective data masking circuit to receive a respective data signal from the data masking circuit, and each data compression circuit operable to compare each of the data signals applied on its respective inputs to an expected value and generate an active error signal on a respective external terminal responsive to any of the applied data signals not having the corresponding expected value; and a test control circuit coupled to the data masking circuits and the read data compression circuits, and coupled to receive a test signal on an external terminal, the test control circuit operable during a first test mode of operation to apply test data stored in addressed memory cells in the arrays to the read data masking circuits, the control circuit disabling the data masking signals during the first test mode so the addressed data is not masked and controlling the data compression circuits to generate the respective error signals responsive to the applied data, the control circuit operable during a second test mode when the test signal goes active responsive to at least one of the generated error signals going active to control the data masking signals to sequentially mask respective data signals applied to the data compression circuits; and a memory tester coupled to the external terminals of the embedded memory device, the memory tester controlling the test control signal to place the embedded memory device in the first test mode of operation, and thereafter controlling the test control signal to place the memory device in the second test mode responsive to any of the generated error signals going active, and the memory tester detecting a defective memory cell responsive to the generated error signals during the second test mode.

18. The test system of claim 17 wherein the wherein the memory device comprises a DRAM.

19. The test system of claim 17 wherein the memory tester generates write test data that is applied to embedded memory device and transferred to the memory cells before the first test mode of operation.

20. A computer system, comprising:

a data input device;

a data output device; and computing circuitry coupled to the data input and output devices, the computing circuitry including an embedded memory device comprising:

a plurality of external terminals including at least one terminal adapted to receive a test signal;

a logic circuit coupled to some of the external terminals and operable to perform a desired function; and a memory device coupled to the logic circuit through internal address, control, and data busses, the memory device comprising:

an address decoder coupled to the address bus;

a control circuit coupled to the control bus;

a plurality of arrays coupled to the address decoder and read/write circuit, each array including a plurality of memory cells; and a test circuit coupled to the at least one external terminal adapted to receive the test signal, the test circuit comprising:

a plurality of data masking circuits, each data masking circuit being coupled to a respective one of the arrays and operable to transfer data signals between addressed memory cells in the array and the data bus, the data masking circuit masking each data signal responsive to a data masking signal;

a plurality of read data compression circuits, each read data compression circuit having a plurality of inputs, each input being coupled to a respective data masking circuit to receive a respective data signal from the data masking circuit, and each data compression circuit operable to compare each of the data signals applied on its respective inputs to an expected value and generate an active error signal on a respective external terminal responsive to any of the applied data signals not having the corresponding expected value; and a test control circuit coupled to the data masking circuits and the read data compression circuits, and coupled to receive a test signal on an external terminal, the test control circuit operable during a first test mode of operation to apply test data stored in addressed memory cells in the arrays to the read data masking circuits, the control circuit disabling the data masking signals during the first test mode so the addressed data is not masked and controlling the data compression circuits to generate the respective error signals responsive to the applied data, the control circuit operable during a second test mode when the test signal goes active responsive to at least one of the generated error signals going active to control the data masking signals to sequentially mask respective data signals applied to the data compression circuits.

21. The computer system of claim 20 wherein the embedded memory device comprises an embedded DRAM.

22. A method of testing memory cells in an embedded memory device including an array of memory cells and a logic circuit, comprising:

placing the embedded memory device in a test mode of operation;

in a first test mode, transferring test data to the memory cells;

reading test data from the memory cells;

compressing the read test data from groups of memory cells, the compressing being performed within the memory device;

generating a test bit within the embedded memory device responsive to the compressed the read data from each group;

detecting a defective group of memory cells when the test bit has a value indicating at least one of the memory cells the corresponding group is defective;

masking the read data from selected bits in the defective group; and in a second test mode, sequentially compressing the masked read data within the embedded memory device to detect the specific defective memory cell in the defective group.

23. The method of claim 22 wherein masking the read data comprises:

masking the bit from a selected memory cell in the defective group;

compressing the masked bit along with the data from all other bits in the group;

generating a test bit responsive to the compressed data;

determining the masked bit is the defective bit in the defective group when the generated test bit has a value indicating no cells in the group are defective; and repeating the operations of masking the bit through determining the masked bit to sequentially mask each bit in the group until the defective bit is determined.

24. The method of claim 22 wherein transferring test data to the memory cells comprises transferring test data having a first binary value to all the memory cells in the arrays.

25. A method of testing memory cells in an embedded memory device including an array of memory cells, a logic circuit, and at least one external terminal, the method comprising:

in a first test mode, transferring data to the memory cells;

reading test data from the memory cells;

compressing the read test data;

generating an error bit responsive to the compressed the read data;

applying the error bit on a respective external terminal;

in a second test mode, sequentially masking respective bits of the applied read test data responsive to the error bit going active; and monitoring the error bit as the respective bits are sequentially masked to detect a defective memory cell.

26. The method of claim 25 wherein the test data read from the memory cells comprises a plurality of bits all having the same binary value when none of the memory cell is defective.

27. A test circuit in an embedded memory device including a plurality of arrays of memory cells and a logic circuit, the test circuit comprising:

at least one external terminal;

a plurality of data masking circuits, each data masking circuit being coupled to a respective one of the arrays and operable to transfer data signals to and from addressed memory cells in the array, the data masking circuit masking respective data signals responsive to a data masking signal;

a plurality of read data compression circuits, each read data compression circuit having a plurality of inputs, each input being coupled to a respective data masking circuit to receive a respective data signal from the data masking circuit, and each data compression circuit operable to compare each of the data signals applied on its respective inputs to an expected value and generate an active error signal on a respective external terminal responsive to any of the applied data signals not having the corresponding expected value; and a test control circuit coupled to the data masking circuits and the read data compression circuits, the test control circuit operable during a first test mode of operation to apply test data stored in addressed memory cells in the arrays to the read data masking circuits, the control circuit disabling the data masking signals during the first test mode so the addressed data is not masked and controlling the data compression circuits to generate the respective error signals responsive to the applied test data, the control circuit operable during a second test mode responsive to at least one of the generated error signals going active to control the data masking signals to sequentially mask respective data signals applied to the data compression circuits causing the compression circuits to generate error signals indicating the location of a defective memory cell.

28. The test circuit of claim 27 wherein each data masking circuit comprises:

a plurality of helper flip-flop circuits, each helper flip-flop circuit coupled to a respective pair of digit lines in the corresponding array;

a plurality of bi-directional data buffer circuits, each data buffer circuit having a first signal terminal coupled to a respective helper flip-flop and a second signal terminal, and a masking terminal coupled to receive a respective data mask signal, the buffer circuit operable to transfer data between its first and second terminals when the data mask signal is inactive and presenting a high impedance between signal terminals when the data mask signal is active; and a plurality of NAND gates, each NAND gate applying the data mask signal to a respective data buffer circuit, and each NAND gate generating the data mask signal to mask data transferred by the data buffer circuit responsive to a bit mask signal and a respective one of the masking signals.

29. The test circuit of claim 28 wherein each data buffer circuit comprises a pair of cross-coupled buffers, each buffer having an enable terminal coupled to receive the data mask signal.

30. The test circuit of claim 27 wherein each data compression circuit comprises and NAND gate and NOR gate each receiving each of the applied data signals on a respective input, the NAND and NOR gates applying respective outputs to an XOR gate the generates the error signals on its output responsive to any of the applied data signals having a different binary value than all the other applied data signals.

31. The test circuit of claim 27 wherein the test control circuit detects a defective memory cell storing an erroneous data signal by sequentially activating each of the masking signals and causing the data masking circuit to drive the error signal inactive when the erroneous data signal is masked, the test control signal being applied to the control circuit responsive to the error control signal going inactive to indicate the present memory cell being masked is the defective cell.

32. The test circuit of claim 27 further wherein the test control circuit further operates to generate control signals to replace the row of memory cells containing the defective memory cell with a redundant row of memory cells.

33. A test circuit in an embedded memory device including a plurality of arrays of memory cells and a logic circuit, the test circuit comprising:

at least one external terminal;

data masking means being coupled to a respective one of the arrays for transferring data signals to and from addressed memory cells in the array and for masking each data signal responsive to a data masking signal;

read data compression means coupled to the data masking means for receiving a respective data signal from the data masking means and for comparing each of the data signals to an expected value and for generating an active error signal on a respective external terminal responsive to any of the data signals not having the corresponding expected value; and test control means coupled to the data masking and read data compression means for applying test data stored in addressed memory cells in the arrays to the data masking means during a first test mode of operation, and for disabling the data masking signals during the first test mode so the addressed data is not masked and controlling the data compression means to generate the respective error signals responsive to the applied test data, and the test control means controlling the data masking signals to sequentially mask respective data signals applied to the data compression means to thereby generate error signals indicating the location of a defective memory cell during a second test mode of operation that is entered responsive to at least one of the generated error signals going active.

\* \* \* \* \*